(12) United States Patent
LaBarge et al.

(10) Patent No.: US 7,244,493 B2
(45) Date of Patent: Jul. 17, 2007

(54) COATED ARTICLE

(75) Inventors: William J. LaBarge, Bay City, MI (US); Rick D. Kerr, Fenton, MI (US); Russell H. Bosch, Gaines, MI (US)

(73) Assignee: Delphi Technologies, Inc., Troy, MI (US)

( * ) Notice: Subject to any disclaimer, the term of this patent is extended or adjusted under 35 U.S.C. 154(b) by 222 days.

(21) Appl. No.: 10/987,607

(22) Filed: Nov. 12, 2004

(65) Prior Publication Data

US 2006/0105171 A1    May 18, 2006

(51) Int. Cl.
    *B32B 9/00* (2006.01)
(52) U.S. Cl. .................. 428/336; 428/408; 428/446; 428/457; 428/698; 428/704
(58) Field of Classification Search .......... 428/704, 428/408, 216, 336, 446, 457, 698
    See application file for complete search history.

(56) References Cited

U.S. PATENT DOCUMENTS

| | | | | |
|---|---|---|---|---|
| 4,619,865 | A | 10/1986 | Keem et al. | 428/333 |
| 6,171,454 | B1 | 1/2001 | Weber et al. | 204/192.12 |
| 6,220,203 | B1 | 4/2001 | Burger et al. | 118/723 |
| 6,325,385 | B1 * | 12/2001 | Iwashita et al. | 277/442 |
| 6,368,717 | B1 | 4/2002 | Rauschnabel et al. | 428/447 |
| 6,372,303 | B1 | 4/2002 | Burger et al. | 427/569 |
| 6,528,115 | B1 | 3/2003 | Hirano et al. | 427/249.1 |
| 6,749,813 | B1 * | 6/2004 | David et al. | 428/216 |

OTHER PUBLICATIONS

Properties and Applications of Balzers Wear-Resistant Coatings. Aug. 19, 2002, 2 pages.
Robertson, J. "Diamond-like amorphous carbon". Materials Science & Engineering R-Reports. 37 (4-6): 129-281 May 24, 2002 (Abstract Only).
Ajayi, et al. "Effect of carbon coating on scuffing performance in diesel fules". Tribology Transactions. 44 (2): 298-304 Apr. 2001. (Abstract Only).
Lacerda, et al. "Structural characterization of hard a-C : H films as a function of the methane pressure". Diamond and Related Materials. 11 (3-6): 980-984 Sp. Iss. SI Mar.-Jun. 2002. (Abstract Only).
Fontaine, et al. "Tribochemistry between hydrogen and diamond-like carbone films". Surface & Coatings Technology. 146: 286-291 Sep.-Oct. 2001 (Abstract Only).
Erdemir, et al. "Tribological properties of hard carbon films on zirconia ceramics". Tribology Transactions 39 (3): 735-744 Jul. 1996. (Abstract Only).
Edemir, et al. "Synthesis of diamondlike carbon filsm with superlow friction and wear properties". Journal of Vacuum Science & Technology A-Vacuum Surfaces and Films. 18 (4): 1987-1992 Part 2 Jul.-Aug. 2000.
Racine, et al. "Properties of amorphous carbon-silicon alloys deposited by a high plasma density source". Journal of Applied Physics. 90 (10): 5002-5012 Nov. 15, 2001. (Abstract Only).

Evans, et al. "The effects of structure, composition, and chemical bonding on the mechanical properties of Si-aC:H thin films". Surface and Coatings Technology xx (2002) xxx-xxx. (Abstract Only).
Sung, "The design of exotic superhard materials". Materials Chemistry and Physics. 72 (2): Sp. Iss. 141-146 Nov. 1, 2001. (Abstract Only).
Podgornik, et al. "Rolling contact properties of ta-C coated low alloy steel". Surface and Coatings Technology xx (2002) xxx-xxx. (Abstract only).
Rodil, et al. "Nitrogen incorporation into tetrahedral hydrogenated amorphous carbon" Physica Status Solidi A-Applied Research. 174 (1): 25-37 Jul. 16, 1999 (Abstract Only).
Freire, "Amorphous hydrogenated carbon films: effects of nitrogen and fluorine, incorporation on the film microstructure and mechanical proper-ties: a review". Journal of Non-Crystalline Solids. 304 (1-3): 251-258 Jun. 2002 (Abstract Only).
Dekempeneer, et al. "Abrasion resistant low friction diamond-like multilayers". Surface & Coatings Technology. 142: 669-673 Jul. 2001 (Abstract Only).
Jan, et al. "Improvement of the adhesion of diamond-like carbon coatings induced by ion treatments". Materials Chemistry and Physics. 72 (2): Sp. Iss. 158-162 Nov. 1, 2001 (Abstract Only).
Gupta, et al. "Investigations of teh electron field emission properties and microstructure correlation in sulfur-incorporated nanocrystalline carbon thin films". Journal of Applied Physics. 91 (12): 10088-10097 Jun. 15, 2002. (Abstract Only).
Gupta, et al. "Electron field emission properties of microcrystalline and nanocrystalline carbon thin films deposited by S-assisted hot filament CVD". Diamond and Related Materials 11 (3-6): 799-803 Sp. Iss. IS Mar.-Jun. 2002 (Abstract Only).
Piekoszewski, et al. "The action of lubricants under extreme pressure conditions in a modified four-ball tester". Wear. 249 (3-4): 188-193 May 2001 (Abstract Only).
Mominuzzaman, et al. "Diamond-like carbon by pulsed laser deposition from a camphoric carbon target: effect of phosphorus incorporation". Diamond and Related Materials. 10(9-10): 1839-1842 Sep.-Oct. 2001. (Abstract Only).

* cited by examiner

*Primary Examiner*—Archene Turner
(74) *Attorney, Agent, or Firm*—Paul L. Marshall

(57) ABSTRACT

In one embodiment, a coated article comprises a substrate with a coating comprising diamond like carbon layer, wherein the diamond like carbon layer comprising carbon and sulfur as terminal sulfur functional groups, wherein greater than or equal to about 70 wt % of the carbon present in the diamond like carbon layer comprises a $sp^3$ carbon-to-carbon bond. The diamond like carbon layer has a concentration gradient such that the diamond like carbon layer on a side toward the substrate comprises a lower concentration of sulfur than a surface of the diamond like carbon layer disposed on a side of the layer opposite the substrate. The surface comprises about 0.1 at % to about 15 at % sulfur.

19 Claims, No Drawings

COATED ARTICLE

BACKGROUND

The present disclosure relates to carbon compositions suitable for coatings, particularly coatings for moving parts exposed to harsh environments.

Fuel delivery systems include various moving components that operate at relatively high temperatures and at relatively high pressures. Fuel delivery systems may include rollers, shoes, tappets and the like, which are exposed to vibratory and oscillatory motions. Sliding tappets may be prone to scuffing between the tappet and a corresponding shaft as the tappet alternates direction. Direct metal-to-metal contact of rolling or sliding elements within a diesel or other fuel delivery system may cause false-brinelling, wear, fretting, microploughing, microcutting, scuffing, galling, and eventually failure of the component itself.

Materials comprising sulfur, nitrogen, and phosphorous naturally found in, and/or added to fuels, for example diesel fuel, provide lubricity. However, sulfur, nitrogen, and phosphorous are being removed from fuels to address various environmental and other issues. As such, the lubricity of fuels, in particular the lubricity of diesel fuel, is decreasing. As the lubricity decreases, the scuffing and galling of fuel delivery components increases.

Coating various components of fuel delivery systems with wear resistant coatings is one approach directed to reducing wear. However, coatings such as silicon carbide (SiC), titanium nitride (TiN), titanium carbide (TiC), chromium nitride (CrN), and the like, may not provide for components that meet modern day durability requirements. The hardness and relatively high friction coefficients of carbides and nitrides may cause abrasive wear to occur. Also, the relatively high temperatures needed for carbiding and nitriding can reduce the hardness and fatigue properties of the various components coated therewith.

Tungsten carbide and carbon coatings (WC/C) may be adequate for some surfaces within a fuel delivery system, especially those surfaces having relatively low contact stress including sliding surfaces. However, such coatings may not provide long durability for rolling and scuffing applications where the components are subjected to strong rolling and/or oscillatory sliding motions.

Accordingly, a coating that may be employed to protect various high wear components such as those operational within a fuel delivery system would be beneficial.

SUMMARY

Disclosed herein are coated articles. In one embodiment, the coated article comprises a substrate with a coating comprising diamond like carbon layer, wherein the diamond like carbon layer comprising carbon and sulfur as terminal sulfur functional groups, wherein greater than or equal to about 70 wt % of the carbon present in the diamond like carbon layer comprises a $sp^3$ carbon-to-carbon bond. The diamond like carbon layer has a concentration gradient such that the diamond like carbon layer on a side toward the substrate comprises a lower concentration of sulfur than a surface of the diamond like carbon layer disposed on a side of the layer opposite the substrate. The surface comprises about 0.1 at % to about 15 at % sulfur.

The above-described and other features will be appreciated and understood by those skilled in the art from the following detailed description and appended claims.

DETAILED DESCRIPTION

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item. Additionally, all ranges disclosed herein are inclusive and combinable (e.g., ranges of "up to about 25 wt %, with about 5 wt % to about 20 wt % desired," is inclusive of the endpoints and all intermediate values of the ranges of "about 5 wt % to about 25 wt %," etc.).

Fuel delivery systems require various functioning components to be in contact with an aggressive hydrocarbon medium. In particular, the friction and wear surfaces of a fuel pump and/or a fuel injector component including roller bearings, shoes, tappets and valve needles may be exposed to such a hydrocarbon medium. Surface coatings to protect and facilitate operation of these various components include diamond like carbon coatings having integrated sulfur used alone, or in combination with other coatings to provide a component with improved wear resistance and durability over components without such a coating.

A diamond like carbon coating is a metastable form of amorphous carbon with significant $sp^3$ bonding. Such coatings are described in detail by Robertson (Diamond-like amorphous carbon, Robertson, J., MATERIALS SCIENCE AND ENGINEERING R-REPORTS, 37 (4-6): 129-281 May 24, 2002). The physical properties of diamond like carbon coatings, however, present challenges to using such coatings in fuel delivery systems.

Diamond like carbon coatings are relatively hard materials having relatively high coefficients of friction. Diamond like carbon coatings mixed with molybdenum disulfide or tungsten disulfide provide reduced friction and an improved wear resistance, but only for a short period of time because the particulate disulfides tend separate from the coatings. Once the disulfides have been removed, the relatively high coefficient of friction of the diamond like carbon coating may result in failure of the coating.

Diamond-like carbon coatings are carbon films that can be formed by thermal decomposition of a material gas on a substrate. Monomer gases suitable for deposition of a diamond-like carbon coating include saturated and unsaturated, branched or unbranched aliphatic hydrocarbons, e.g., those having 1 to 8 carbon atoms, and preferably 1 to 4 carbon atoms. Also suitable are aromatic hydrocarbons, e.g., those having 6 to 14 carbon atoms. Examples of suitable hydrocarbons include methane, ethane, propane, butane, isobutene, octane, isooctane, ethane, propene, acetylene, benzene, toluene, xylene, and the like, and combinations comprising one or more of the foregoing hydrocarbons. Exemplary techniques of forming the diamond-like carbon coating include, for example, plasma chemical vapor deposition (CVD), radio frequency (RF) plasma CVD, direct current (DC) plasma CDV, electron cyclotron resonance (ECR) plasma CVD, and the like.

Integration of sulfur in a diamond like carbon coating improves the durability of the coating by reducing the vaporization of the friction modifier. Hydrogen could be used as a modifier (e.g., modifying amorphous-C to C:H) to reduce the friction coefficient of diamond like carbon coatings without affecting the coating hardness. However, the hydrogen can be removed at high temperatures (i.e., temperatures greater than or equal to about 90° C.), thus increasing the friction coefficient. The increased friction is expected to result in transformation of the amorphous carbon with $sp^3$ bonding to graphite with $sp^2$ bonding, which is then readily consumed, ultimately leading to coating failure. It is believed that since sulfur displays more metallic properties than does hydrogen, the sulfur incorporated into the diamond like carbon coating will not be as easily lost as is hydrogen and/or other materials incorporated into a similar coating.

In particular, sulfur is integrated as terminal sulfur groups within the amorphous carbon structure, e.g., as S, S—H, and a combination comprising at least one of the foregoing groups. The integrated sulfur replaces at least a portion of the terminal hydrogen in the structure, with replacement of greater than or equal to about 60 atomic percent (at %) of all of the terminal hydrogen with sulfur desirable. Preferably, the sulfur is integrated into the amorphous carbon structure in a form similar to and/or identical to the sulfur compounds found naturally in, and subsequently being removed from, the fuel. Accordingly, the integrated sulfur disclosed herein is not particulate, and also not considered to be a sulfide. Instead, the sulfur is covalently bonded to, physically associated with, and/or otherwise attached to the amorphous carbon (a-C—), e.g., as (—C:S) and (—C:S:H).

The sulfur is integrated into the diamond like carbon, e.g., by gas phase deposition of hydrogen sulfide and/or direct current (DC) sputtering of a target containing sulfur. The sulfur-containing diamond-like carbon coating can be formed as a gradient or graduated layer. At the start-of deposition, methane gas, for example, is used to deposit the carbon coating. The methane gas will decompose to form a 100% carbon coating. After greater than or equal to about 70% of the total thickness of the layer has been deposited, hydrogen sulfide gas is introduced in addition to the methane. The hydrogen sulfide gas concentration can be increased as desired until the single layer is deposited. In this manner, a single, graduated layer can be formed; a sulfur concentration gradient, increasing toward the surface of the coating (layer). For example, the beginning of the layer can comprise about 100 atomic percent (at %) carbon and 0 at % added sulfur, with the surface comprising about 90 at % carbon and 10 at % sulfur.

For example, a coating may comprise multiple layers, e.g., hundreds of layers, with each layer starting with pure diamond like carbon and ending with a carbon/sulfur, wherein the sulfur is covalently bonded to the carbon (e.g., about 90 at % carbon and 10 at % sulfur). The carbon component provides the structural stability of the layer. The hydrogen component greatly reduces the friction at the interface. However, without the sulfur, the hydrogen rapidly reacts with other species, and can easily be lost. Once the hydrogen is lost, the rest of the carbon layer is rapidly consumed. Eventually the layer will be worn down to nothing and a new layer will be reached, with the top surface of the new layer having the high concentration of friction reducing hydrogen.

In the present coating, the surface of the layers also includes sulfur, which further enhances durability and reduces the rate of consumption of the layer compared to a hydrogen enhanced layer. High durability is particularly obtained at sulfur concentrations of greater than or equal to about 5 at %, with greater than or equal to about 8 at % preferred. In order to retain the structural integrity of the layer with sufficient diamond like carbon, a sulfur concentration of less than or equal to about 15 at % is preferred, with less than or equal to about 12 at % more preferred. For example, a surface concentration can be about 8 at % to about 12 at % sulfur, less than or equal to about 10 at % hydrogen, balance carbon. Since, the layer(s) can wear away with the carbon and hydrogen consumed by the fuel, while the inorganic sulfur is not soluble in the fuel and can form sulfur particulates (e.g., nanoscale particulates), sulfur may remain when a single layer is consumed such that the exposed surface of a new layer may be "contaminated" by residual sulfur from the old layer. Therefore instead of a constant concentration gradient through each layer of 90 at.% carbon-10 at.% sulfur, a more complicated graded sulfur concentration can be employed such that the residual sulfur is taken into account. As a result, initially, the sulfur gradient through the entire coating can be from less than or equal to about 3 at % in contact with the substrate to a sulfur concentration of about 8 at % to about 15 at % at the surface of the coating, with the sulfur concentration gradient of the outermost layer being less than or equal to about 3 at % at the outermost layer interface with the subsequent layer to a concentration of about 8 at % to about 15 at % at the surface of the outermost layer (with about 8 at % to about 12 at % desirable). The subsequent layer can have a lower sulfur concentration gradient that the outermost layer such that, when the outermost layer is worn away and the subsequent layer is exposed, it comprises the desired sulfur surface concentration (i.e., the initial surface concentration of the subsequent layer plus the added sulfur due to the remaining sulfur particulates from the outermost layer). Herein the "surface" of each layer is considered the side of the layer opposite the substrate.

The diamond like carbon coating preferably includes greater than or equal to about 85 at % carbon, and about 0.1 at % to about 15 at % sulfur, based on the total atomic composition of the diamond like carbon coating. Specifically, about 1 at % to about 8 at % sulfur can be employed, more specifically, about 3 at % to about 7 at % sulfur, and even more specifically, about 5 at % to about 6 at % sulfur.

The diamond like carbon coating preferably includes carbon involved in sp carbon-carbon bonding. $Sp^3$ bonded carbon refers to single bonded carbon commonly associated with diamond. $Sp^2$ bonded carbon, in contrast, refers to double bonded carbon commonly associated with graphite. Preferably, greater than or equal to about 70 weight percent (wt %) of the carbon present in the coating is present in the form of $sp^3$ carbon-carbon bonding, based on the total weight of the carbon present in the diamond like carbon coating. Specifically, $sp^3$ carbon-carbon bonding of greater than or equal to about 75 wt % may be employed, with greater than or equal to about 80 wt % preferred, and greater than or equal to about 82 wt % more preferred.

The diamond like carbon coating preferably has a coefficient of friction of less than or equal to about 0.4 (e.g., about 0.1 to about 0.4), as measured with pin-disc-tribological tests under dry sliding conditions in air and at room temperature (e.g., about 25° C.). A coefficient of friction of about 0.12 to about 0.30 can be employed, with a coefficient of friction of about 0.15 to about 0.25 preferred, and a coefficient of friction of about 0.18 to about 0.20 more preferred.

A sufficient coating thickness to provide suitable lubricity can be employed, e.g., typically a total coating thickness of less than or equal to about 5 micrometers. Although a total coating thickness can be about 1 nanometer to about 2,000 nanometers, a thickness of greater than or equal to about 100 nm, e.g., about 100 nanometers (nm) to about 900 nm can generally be employed to attain the desired lubricity. Specifically, coating thicknesses of about 200 nm to about 800 nm can be employed, more specifically, about 400 nm to about 700 nm. The coating may be a single layer or a multi layer coating. In a multi-layer coating, the individual layers may be the same or different (in composition and thickness), wherein, with a multi-layer coating, the individual diamond like carbon layers desirably have a thickness of about 1 nm to about 100 nanometers, with an about 20 nm to about 40 nm thickness per layer more desirable.

One or more of the diamond like carbon coating layer(s) may further include metal carbide and/or silicon, e.g., an inter-dispersed matrix of diamond like carbon (DL carbon) and metal carbide clusters and/or an inter-dispersed matrix of diamond like carbon and diamond like silicon. For example, a first layer starting at 100 at % carbon and ending at 90 at % carbon-10 at % sulfur can be formed. Then, a subsequent layer comprising, for example, tungsten carbide-carbon can be deposited. Preferably tungsten carbide comprises greater than or equal to about 70 at % of the tungsten carbide-carbon layer. The tungsten carbide-carbon layer (e.g., tungsten carbide-carbon) may comprise 100 at % tungsten carbide-carbon, or may alternatively be sulfur rich at the surface, i.e. about 90 at % tungsten carbide-carbon, about 10 at % sulfur at the surface of the second layer. The next layer (e.g., on the side of the second layer opposite the first layer) can be a repeat of the first layer, for example, starting at 100 at % carbon and ending at about 90 at % carbon and about 10 at % sulfur, while the fourth layer can be a repeat of the second layer, for example, starting at 100 at % tungsten carbide-carbon and ending at about 90 at % tungsten carbide and about 10 at % sulfur.

The metal carbide-carbon may be deposited by chemical vapor deposition (CVD) of a metal precursor (such as tungsten hexafluoride ($WF_6$)) in the presence of methane or some other reducing gas. Exemplary metal carbides include carbides of tungsten, molybdenum, titanium, and combinations comprising at least one of the foregoing.

The coating may also comprise one or more layers formed by reduction of the metal carbide content (i.e., an concentration gradient) near an outer surface of the layer, such that the outer regions of the coating are primarily diamond like carbon. The inter-dispersed matrix may be bombarded with an energetic beam of ions for a time sufficient to cohesively bond the metal carbides to the diamond-like carbon. The bombarding ions or ionic species may be formed from nitrogen, argon, helium, neon, methane, hydrogen, and combinations comprising at least one of the foregoing ions.

The diamond like carbon coating may further include silicon compounds to form an inter-dispersed matrix of diamond like carbon and diamond like silicon regions. Gas phase silicon compounds such as, for example, methyltrichlorosilane may be employed. Methane and methyltrichlorosilane gas may be mixed in a ratio such that the deposited amorphous carbon:silicon material would be in an about 90:10 ratio, for example. Amorphous silicon incorporation may improve the durability of amorphous carbon and amorphous carbon-hydrogen layers. The addition of sulfur may improve the durability of coatings comprising silicon and carbon. Preferably the concentration of amorphous silicon relative to the amorphous carbon layer would not change. For example, the initial deposition of a layer might comprise 100 at % amorphous material as about 90 at % carbon and about 10 at % silicon. The final deposition of that layer might contain about 10 at % sulfur and about 90 at % amorphous material (e.g., about 81 at % carbon and about 9 at % silicon).

The amorphous material may comprise about 0.1 at % to about 15 at % silicon, based on the total atomic composition of the amorphous material. Specifically, about 1 at % to about 15 at % silicon can be employed, more specifically, about 3 at % to about 12 at % silicon, and even more specifically, about 5 at % to about 10 at % silicon. In other words, the non-sulfur portion of a layer may comprise "amorphous materials" including 100 at % amorphous carbon, 90 at % carbon and 10 at % hydrogen, 90 at % carbon and 10 at % silicon, wherein the hydrogen and/or silicon can be present in amounts of about 0.1 at % to about 15 at %, specifically, about 3 at % to about 12 at %, and more specifically about 5 at % to about 10 at %, based upon the total atomic composition of the amorphous materials.

In addition to the diamond like carbon coating layer(s), the coated substrate may also comprise a metal bonding layer. The metal bonding layer, which is preferably disposed between the substrate and the diamond like carbon coating layer(s), can comprise aluminum, chromium, titanium, cobalt, nickel, molybdenum, tungsten, and combinations comprising one or more of the foregoing metals. A metal bonding layer may be formed, for example, by nitriding, carbiding, or boriding, the metal or metal alloy from which the substrate is made. Alternatively, the metal bonding layer may be co-deposited with a nitriding, carbiding, and/or boriding gas. The metal bonding layer may have a thickness of about 10 nm to about 120 nm, specifically about 20 nm to about 100 nm, and more specifically, about 40 nm to about 90 nm.

In addition to the optional metal bonding layer, and the carbide in the matrix of the diamond like carbon coating layer, the coated substrate may comprise, "hard" or "very hard" material layer(s) such as a tungsten carbide/carbon layer, tungsten carbide, and the like. When included, the hard material constitutes 30 at % to about 50 at % hard material. For example, the hard material layer can comprise 30 at % tungsten carbide. As used herein, a "hard" material has a VHN (Vickers hardness number) of about 750 VPN (7.5 GPa) to 1,000 VPN (10 GPa). Preferably, the hard material layer contacts sulfur at a boundary between the hard layer and the diamond like carbon layer, e.g., ($\alpha$-C:S:WC/C). In another embodiment, a "very hard" material layer such as tungsten carbide (WC), and the like, may also be incorporated into the coating, e.g., ($\alpha$-C:S—(WC)). As used herein, a "very hard" material (e.g., amorphous carbon) has a VHN of greater than 1,000 VPN (10 GPa) to about 6,000 VPN (60 GPa). The thickness of the hard or very hard material layer may be about 5 nm to about 100 nm, specifically, about 15 nm to about 70 nm, and more specifically, about 25 nm to about 40 nm.

The coating disclosed herein is believed to exhibit good affinity for lubricants and to provide suitable resistance to abrasion and impact wear, while being suitable for functioning within an aggressive hydrocarbon medium such as fuel. The coating is also believed to be suitable under various temperature, pressure, and operational conditions. Some possible uses include diesel fuel pumps (e.g., rollers, shoes, tappets, valve needles, and the like), fuel injectors, and the like.

Unlike carbon coatings comprising disulfide (e.g., tungsten disulfide and/or molybdenum disulfide), sulfur-terminated diamond like carbon coatings exhibit extended wear and lower friction. Unlike the disulfide, the sulfur in the sulfur terminated carbon coatings is covalently bonded thereto and does not pull out of the carbon coatings.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A coated article, comprising:
   a substrate with a coating comprising a diamond like carbon layer, wherein the diamond like carbon layer comprises carbon and terminal sulfur functional groups, and wherein greater than or equal to about 70 wt % of the carbon present in the diamond like carbon layer comprises a $sp^3$ carbon-to-carbon bonds;
   wherein the diamond like carbon layer has a sulfur concentration gradient such that the diamond like carbon layer on a side toward the substrate comprises a lower concentration of sulfur than a surface of the diamond like carbon layer disposed opposite the substrate, and
   wherein the surface comprises about 0.1 at % to about 15 at % sulfur.

2. The coated article of claim 1, wherein the terminal sulfur functional groups are chosen from S, S—H, and a combination comprising at least one of the foregoing groups.

3. The coated article of claim 1, further comprising a metal bonding layer disposed between the substrate and the diamond like carbon layer.

4. The coated article of claim 3, wherein the metal bonding layer is about 10 nanometers to about 120 nanometers thick.

5. The coated article of claim 3, wherein the metal bonding layer comprises a metal chosen from aluminum, chromium, cobalt, nickel, molybdenum, tungsten, and a combination and alloy comprising at least one of the foregoing metals.

6. The coated article of claim 1, wherein the diamond like carbon layer further comprises metal carbide clusters.

7. The coated article of claim 6, wherein the metal carbide clusters are chosen from tungsten carbides, molybdenum carbides, titanium carbides, and combinations comprising at least one of the foregoing metal carbides.

8. The coated article of claim 6, wherein the metal carbide clusters are cohesively bonded to the diamond like carbon layer.

9. The coated article of claim 1, wherein the diamond like carbon layer further comprises silicon.

10. The coated article of claim 9, wherein the silicon is present throughout the diamond like carbon layer such that the diamond like carbon layer comprises greater than or equal to about 85 at % amorphous material, based upon the total atomic composition of the diamond like carbon layer, and wherein the amorphous material comprises about 0.1 at % to about 15 at % silicon, based upon the total atomic composition of the amorphous material.

11. The coated article of claim 10, wherein the amorphous material comprises about 3 at % to about 12 at % silicon.

12. The coated article of claim 1, further comprising a hard material layer of a hard material having a Vickers Hardness Number of about 7.5 GPa to about 10 GPa.

13. The coated article of claim 12, wherein the hard material layer comprises tungsten carbide.

14. The coated article of claim 13, wherein the tungsten carbide is present in an amount of about 30 at % to about 50 at %, based upon the total atomic composition of the hard material layer.

15. The coated article of claim 13, wherein the hard material layer comprises $sp^2$ bonding carbon.

16. The coated article of claim 1, wherein the coating comprises a plurality of diamond like carbon layers, wherein each diamond like carbon layer has a thickness of about 1 nanometer to about 100 nanometers.

17. The coated article of claim 1, wherein the total thickness of the coating is about 100 nanometers to about 2,000 nanometers.

18. The coated article of claim 1, wherein the article is a fuel delivery system component chosen from a roller bearing, a shoe, a tappet, and a valve needle.

19. A coated article, comprising:
   a substrate with a coating comprising diamond like carbon layer thereon, the diamond like carbon layer comprising carbon and sulfur as terminal sulfur functional groups, wherein greater than or equal to about 70 wt % of the carbon present in the diamond like carbon layer comprises a $sp^3$ carbon-to-carbon bond; wherein the diamond like carbon layer has a concentration gradient such that the diamond like carbon layer on a side toward the substrate comprises a lower concentration of sulfur than a surface of the diamond like carbon layer disposed opposite the substrate, wherein the surface comprises about 0.1 at % to about 15 at % sulfur;
   a metal bonding layer disposed between the diamond like carbon layer and the substrate;
   a tungsten carbide-carbon layer disposed on the coating.

\* \* \* \* \*